United States Patent [19]

Howell

[11] Patent Number: 4,936,410

[45] Date of Patent: Jun. 26, 1990

[54] SPEAKER COVER

[76] Inventor: Les P. Howell, 630 Strathnaver Avenue, Selkirk, Manitoba, Canada, R1N 0J2

[21] Appl. No.: 245,570

[22] Filed: Sep. 19, 1988

[51] Int. Cl.[5] .......... H05K 5/00

[52] U.S. Cl. .......... 181/148; 181/150; 181/175; 181/199

[58] Field of Search .......... 181/147–150, 181/157, 160, 167, 170, 175, 199, 144; 381/156, 189, 193, 205

[56] References Cited

U.S. PATENT DOCUMENTS

| | | | |
|---|---|---|---|
| 4,133,975 | 1/1979 | Barker, III | 181/144 X |
| 4,325,455 | 4/1982 | Kirkpatrick | 181/148 |
| 4,466,505 | 8/1984 | Ritter | 181/144 |
| 4,503,292 | 3/1985 | Johnson et al. | 381/193 |
| 4,769,188 | 9/1988 | Graham et al. | 264/51 |

*Primary Examiner*—Benjamin R. Fuller
*Attorney, Agent, or Firm*—Murray E. Thrift; Stanley G. Ade; Adrian D. Battison

[57] ABSTRACT

A cover system covers the radiating faces of a loud speaker enclosure. It includes a sheet of flaccid material, such as a sheet of textile fabric printed with an ornamental design and provided with a border of "VELCRO" felt. The speaker radiating face carries either a complete peripheral border or segments of the hook component of a "VELCRO" fastener that is engagable with the felt. In use, the borders of the sheet are rolled up and stuck onto the hook strips to hold the sheet in place. The system makes the customizing of domestic and other loud speaker enclosure very simple.

12 Claims, 1 Drawing Sheet

SPEAKER COVER

FIELD OF THE INVENTION

The present invention relates to loud speakers, and more particularly to a system for covering the radiating face of a loud speaker enclosure for either commercial or domestic use.

BACKGROUND

The conventional loud speaker is a rectangular enclosure with radiators opening on a front face of the enclosure. This radiating face is conventionally covered with a grill cloth for aesthetic reasons. The cloth itself is usually mounted on a rigid backing material so that the cloth and backing form what is in essence a rigid, acoustically transparent panel. These are conventionally a single dark colour to blend in with the remainder of the speaker.

Many loud speakers are used in settings where the presence of a dark, rectangular box is not exceptionally aesthetically pleasing. The present invention aims at the provision of a system whereby conventional loud speaker enclosure may be provided with a "custom" appearance to suit the decor of the room in which they are situated, to suit the music being played through the speakers or to suit the mood of a room's occupants.

SUMMARY

According to the present invention there is provided a cover system for covering a radiating face of a loud enclosure comprising:

a sheet of flaccid material to be stretched over the radiating face of the speaker;

a first fastener component in the form of a band extending along and secured to the periphery of the sheet of flaccid material;

a second fastener component engagable with the first fastener component; and means for securing the second fastener component to the loud speaker, at the periphery of the radiating face.

The sheet of flaccid material will normally be a sheet of textile fabric bearing a suitable ornamental appearance, whether it be monochromatic, a print of one sort or another, a tie-dye pattern or the like.

The preferred fastener components are a band of felt stitched or adhesively secured around the periphery of the sheet, on its front face and a mating hook fastener of the type used in the hook and loop file fastener material sold under the trade mark "VELCRO". The hook material is preferably supplied with an adhesive backing so that it can be applied around the periphery of the radiating face of the loud speaker enclosure. The felt borders of the sheet maY then be rolled or folded back and secured to the hook material to stretch the sheet over the radiating face of a loud speaker enclosure. In preferred embodiments, the band of felt is fairly wide and the sheet of material and the band of felt is slit at the corners of the sheet so that a wide range of speaker enclosure sizes can be accommodated with a single sheet. The sheets may readily be changed with the decor of a room, with the music being played or at the whim of a room's occupants.

BRIEF DESCRIPTION OF THE DRAWINGS

In the accompanying drawings, which illustrate an exemplary embodiment of the present invention.

DETAILED DESCRIPTION

Figure 1:
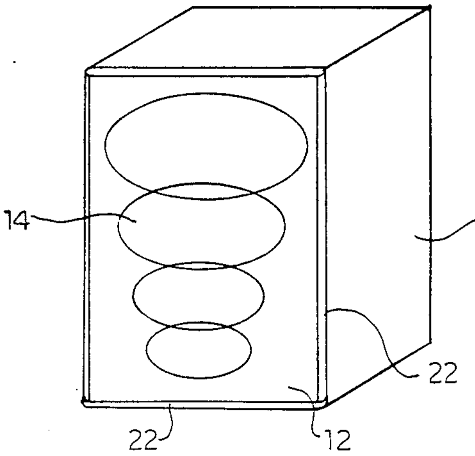
FIG. 1 is an isometric view illustrating a loud speaker enclosure equipped with a cover according to the present invention.

Referring to the accompanying drawings, Figure 1 illustrates a speaker enclosure 10 of a loud speaker with a cover 12 over the radiating face of the enclosure This bears an ornamental design 14 on its front face, which may be selected to suit the wishes of the speaker's owner or user.

Figure 2:
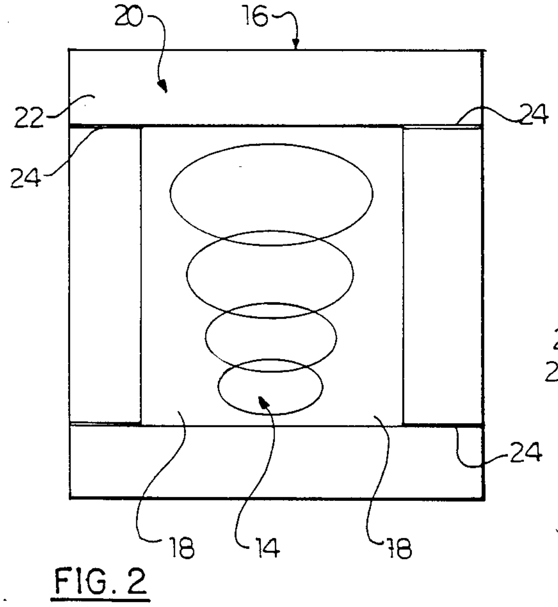
FIG. 2 illustrates the front face of a cover sheet according to the present invention.

As illustrated in FIG. 2, the cover system includes a sheet 16 of flaccid textile fabric that is rectangular in outline shape and carries the ornamental design 14 on a rectangular central area 18. Outside the central area is a border 20 that is covered with a band of felt 22. This material is commercially available as "VELCRO" felt and is suitable for engagement with the hook component of the hook and loop file fasteners sold under the trade mark "VELCRO". The sheet and the felt have slits 24 adjacent each corner. In the illustrated embodiments, the slits 24 extend in from the side edges of the sheet. In other embodiments, they may extend to the centre from the top or they may extend from the corners towards the centre of the sheet.

Figure 3:
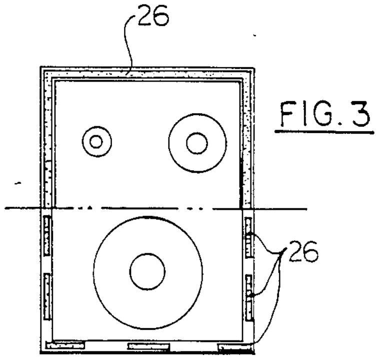
FIG. 3 illustrates the radiating surface of a loud speaker enclosure equipped with a hook fastener according to the present invention.
Figure 4:
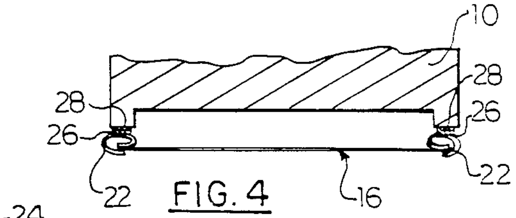
FIG. 4 is a view along line IV—IV of FIG. 1.

FIG. 3 illustrates a hook fastener 26 secured to speaker the enclosure at the edge of the radiating face. In the upper half of FIG. 3, the hook fastener material is a strip secured completely around the periphery of the radiating face, while on the lower half, short segments of the hook material are located at strategic locations on the periphery of the radiating face. As most particularly illustrated in FIG. 4, the hook component is secured to the speaker enclosure by a layer of pressure sensitive adhesive 28 on the back face of the strip of hook material. FIG. 4 also illustrates the rolling of the edges of the sheet 16 with the felt on the outside of the roll and adhered to the hook fastener 26 on the sides of the radiating face of the speaker enclosure. This provides an attractive border for the cover sheet. Excess material at the corners of the sheet maY be trimmed with a pair of scissors.

Figure 5:
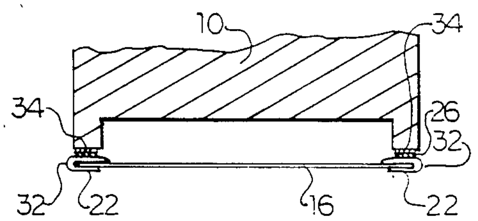
FIG. 5 is a view like FIG. 4 showing an alternative method of fastening the sheet in place.

Instead of rolling the sheet as shown in FIG. 4, a folded border can be provided as illustrated in FIG. 5, where the edges of the sheet have been folded at 32. FIG. 5 also illustrates the use of a double faced pressure sensitive adhesive tape 34 for securing the hook fastener 26 to the front face of the speaker enclosure 10. It is also possible to use other adhesives, for example adhesive pastes or liquids, although the preferred system is an adhesive backing on the hook components as it makes the system extremely simple to apply.

The border of felt 22 applied to the sheet 16 may be held in place by box stitching or by a suitable adhesive.

With the system of the present invention, it is possible for an individual to readily change the appearance of his loud speaker enclosure, simply by installing the hook fasteners 26 so that a sheet 16 can be applied over the radiating face, thus making the speaker enclosure an ornamental item that augments the decor of the room in which it is located. Alternatively, the speaker cover may be used to reflect the music being played, in which case covers would be likelY to be changed with some frequency. This is very easy with the system of the present invention as it simply involves removing one sheet and applying another, a process that takes very little time. The sheets themselves can be made to fit a wide range of speaker enclosure sizes simplY by rolling or folding back the edges until the size of the sheet matches the size of the speaker radiating face. Excess material at the corners can be snipped off with a pair of scissors.

While certain embodiments of the invention have been described in the foregoing, it is to be understood that other embodiments are possible within the scope of the invention. The invention is to be considered limited solely by the scope of the appended claims.

I claim:

1. A cover system for covering system for covering a radiating face of a loud speaker enclosure comprising:
- a rectangular sheet of flaccid material to be stretched over the radiating face of the enclosure, the sheet having a rectangular central area with four corners, a peripheral border about the central area and four slits in the peripheral border, extending from sides of the sheet to the respective corners of the central area
- a first fastener component comprising a band extending along and secured to the border of the sheet of flaccid material;
- a second fastener component engageable with the first fastener component; and
- means for securing the second fastener component to the loud speaker enclosure, at a periphery of the radiating face.

2. A system according to claim 1 wherein the first fastener component is secured to an outer face of the sheet of flaccid material.

3. A system according to claim 1 wherein the first fastener component is a loop component of a hook and loop pile fastener.

4. A system according to claim 2 wherein the first fastener component is felt.

5. A system according to claim 1 wherein the second fastener component comprises a continuous strip.

6. A system according to claim 1 wherein the second fastener component comprises a plurality of independent fastener sections.

7. A system according to claim 3 wherein the second fastener component comprises a hook component of a hook and loop pile fastener.

8. A system according to claim 4 wherein the second fastener component comprises a hook component of a hook and loop pile fastener.

9. A system according to claim 1 wherein the means for securing the second fastener component to the loud speaker enclosure comprise an adhesive.

10. A system according to claim 9 wherein the adhesive is a pressure sensitive adhesive.

11. A system according to claim 1 wherein the means for securing the second fastener component to the loud speaker enclosure comprise a double faced pressure sensitive adhesive tape.

12. A cover system for covering a radiating face of a loud speaker enclosure comprising:
- a sheet of flaccid material having a central area and a peripheral border thereabout:
- a band of felt secured to the border of the sheet, on a front face thereof;
- slits in the sheet and the band of felt adjacent corners of the sheet;
- a hook fastener component engagable face to face with the felt; and
- adhesive means for securing the hook fastener component to the loud speaker enclosure.

* * * * *